United States Patent
Heyne et al.

(10) Patent No.: US 6,756,820 B1
(45) Date of Patent: Jun. 29, 2004

(54) OPTIMIZED-DELAY MULTIPLEXER

(75) Inventors: Patrick Heyne, München (DE); Thoralf Grätz, Dresden (DE); Dieter Härle, München (DE); Bret Johnson, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/311,118

(22) Filed: May 13, 1999

(30) Foreign Application Priority Data

May 13, 1998 (DE) .......................................... 198 21 455

(51) Int. Cl.[7] .................... H03K 19/20; H03K 17/693
(52) U.S. Cl. .................... 326/106; 326/113; 327/408
(58) Field of Search ................ 326/112–114, 105–108; 327/407–408

(56) References Cited

U.S. PATENT DOCUMENTS 5,233,233 A * 8/1993 Inoue et al. ................ 327/408
5,625,303 A 4/1997 Jamshidi .................... 326/106
5,955,912 A * 9/1999 Ko ............................. 327/410
5,973,507 A * 10/1999 Yamazaki ................... 326/52

FOREIGN PATENT DOCUMENTS

EP 0647030 A2 4/1995
JP 61-195126 12/1986
JP 8-76976 3/1996

* cited by examiner

Primary Examiner—James H. Cho
(74) Attorney, Agent, or Firm—Laurence A. Greenberg; Werner H. Stemer; Ralph E. Locher

(57) ABSTRACT

The optimized-delay multiplexer includes at least two pass elements that are respectively driven via a first path by a control signal directly, and via a second path by the control signal inverted by an inverter. A further pass element is connected in the first path to simulate the delay caused by the inverter. As a result, the at least two pass elements are switched simultaneously.

4 Claims, 1 Drawing Sheet

PRIOR ART

OPTIMIZED-DELAY MULTIPLEXER

BACKGROUND OF THE INVENTION

Field of the Invention

The invention relates to a multiplexer with an optimized delay. The multiplexer comprises at least two pass elements which can each be driven via a first path by a control signal directly, and via a second path by the control signal inverted by an inverter.

Multiplexers and demultiplexers are usually produced using tristate inverters or pass elements or NAND gates. Tristate inverters in this context are inverters which have three states, namely "1", "0" and "high resistance."

FIG. 3 illustrates an exemplary embodiment of a prior art demultiplexer with pass or transfer elements 1, 2 and an inverter 3. The pass element 1 comprises an n-channel MOS transistor 4 and a p-channel MOS transistor 5. Similarly, the pass element 2 comprises an n-channel MOS transistor 6 and a p-channel MOS transistor 7. The transistors 4 and 5 are connected in parallel with one another, as are the transistors 6 and 7. A first input signal IN1 is fed via the source-to-drain path of the transistors 4, 5, while a second input signal IN2 is fed via the source-to-drain path of the transistors 6 and 7. The outputs of the two pass elements 1, 2 are connected to a common output node OUT. The gates of the transistors 5, 6 are driven by a control signal C2 which is equivalent to a control signal CTRL. The gates of the transistors 4, 7 are driven by a control signal C1 obtained from the control signal CTRL via the inverter 3. This means that the control signals C1 and C2 are inverted with respect to one another.

When, in the demultiplexer shown in FIG. 3, the control signal C1 is at "0", then the transistor 4 is on, while the transistor 7 is off. In this case, the control signal C2 is at "1", which means that the transistor 5 is on, while the transistor 6 is off. In other words, when the control signal CTRL is at "1", the pass element 2 is on, while the pass element 1 is off.

In the circuit arrangement shown in FIG. 3, the addition of the inverter 3 now causes the signal C1 to be somewhat delayed in relation to the signal C2, because it has to pass through the inverter 3. In other words, in the circuit arrangement shown in FIG. 3, the pass elements 1, 2 are each driven at different speeds, which is a disadvantage for time-critical applications of the multiplexer or demultiplexer, because, due to the fact driving occurs at different times, the input signals IN1 and IN2 are supplied to the output OUT with the same delay.

SUMMARY OF THE INVENTION

It is accordingly an object of the invention to provide an optimized-delay multiplexer or demultiplexer, which overcomes the above-mentioned disadvantages of the heretofore-known devices and methods of this general type and which is capable of providing a time-synchronous output signal for time-critical applications as well.

With the foregoing and other objects in view there is provided, in accordance with the invention, an optimized-delay multiplexer or demultiplexer, comprising:

a first path carrying a control signal and a second path receiving the control signal;

an inverter connected in the second path for inverting the control signal and forming an inverted control signal;

a first pass element connected in the first path and driven by the control signal directly;

a second pass element connected in the second path and driven by the inverted control signal; and a third pass element connected in the first path for simulating a delay caused by the inverter.

In accordance with an added feature of the invention, the first pass element has an input receiving an input signal and the second pass element has an input receiving an input signal separate from the input signal of the first pass element.

In accordance with an additional feature of the invention, the first pass element has an input receiving an input signal and the second pass element has an input receiving the input signal in an inverted state.

In accordance with a concomitant feature of the invention, the first, second, and third pass elements each include an n-channel MOS transistor and a p-channel MOS transistor connected in parallel with the n-channel MOS transistors.

In other words, the above-noted objects of the invention are satisfied with a multiplexer of the type mentioned in the introduction in which the first control path is provided with an additional pass element which simulates the delay caused by the inverter.

Hence, the optimized-delay multiplexer (or demultiplexer) according to the invention uses an additional optimized pass element in the path of the control signal which is not provided with an inverter. The additional pass element simulates the time delay inevitably introduced by the inverter, so that the respective control signals arrive at the pass elements simultaneously.

It has also been found that pass elements are generally more suitable as "switches" than are tristate inverters, if the latter are observed using a process window. Tristate inverters are active or amplifying switches in which process fluctuations have a much more pronounced effect on the switching speed than on "passive" pass elements. Thus, in a poor p-channel FET, the rising output edge is slow, whereas this is the falling output edge in the case of an n-channel FET. This means that the variation of pass elements obtained from a wafer is smaller than process-related fluctuations during the manufacture of tristate inverters.

The inertia of the pass elements during switching also causes an output signal to be produced which is delayed uniformly with respect to the control signal, even if the individual control signals for the respective pass elements do not switch at exactly the same instant.

Other features which are considered as characteristic for the invention are set forth in the appended claims.

Although the invention is illustrated and described herein as embodied in an optimized-delay multiplexer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
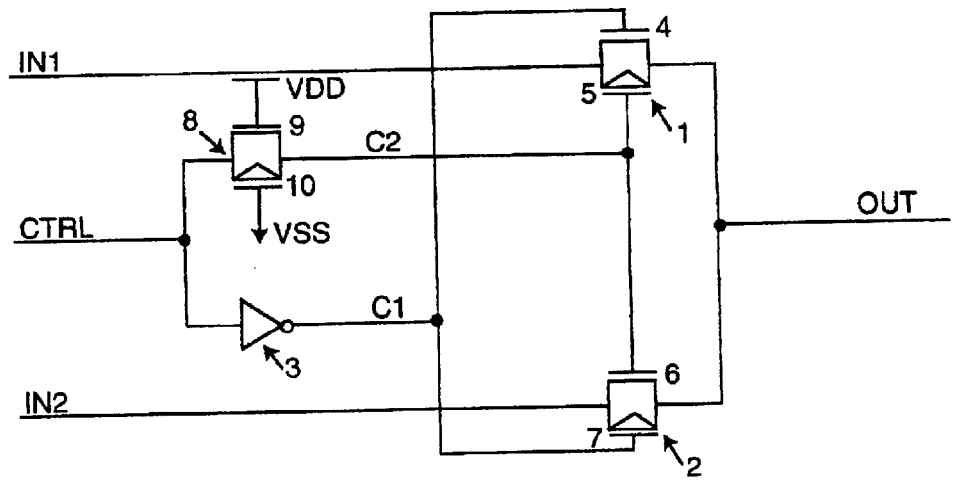
FIG. 1 is a circuit schematic of a first exemplary embodiment of the multiplexer according to the invention.
Figure 2:
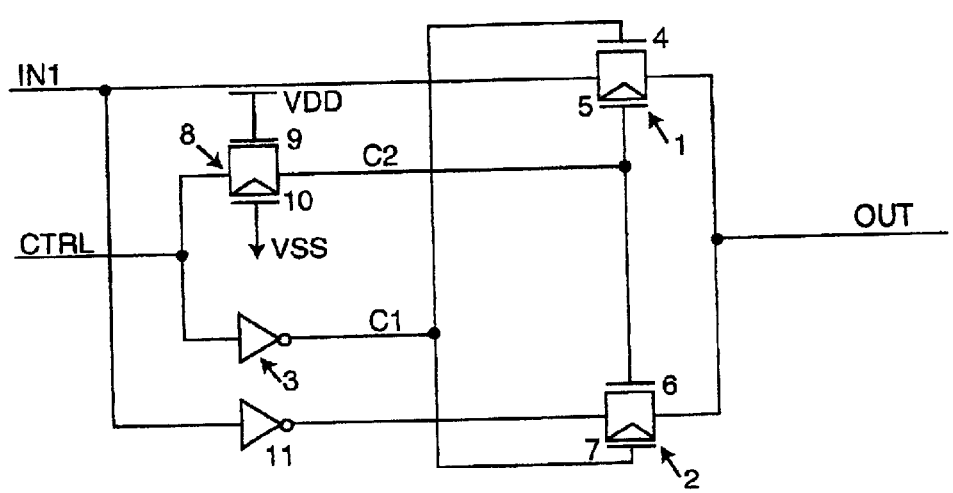
FIG. 2 is a circuit schematic of a second exemplary embodiment of the multiplexer according to the invention.
Figure 3:
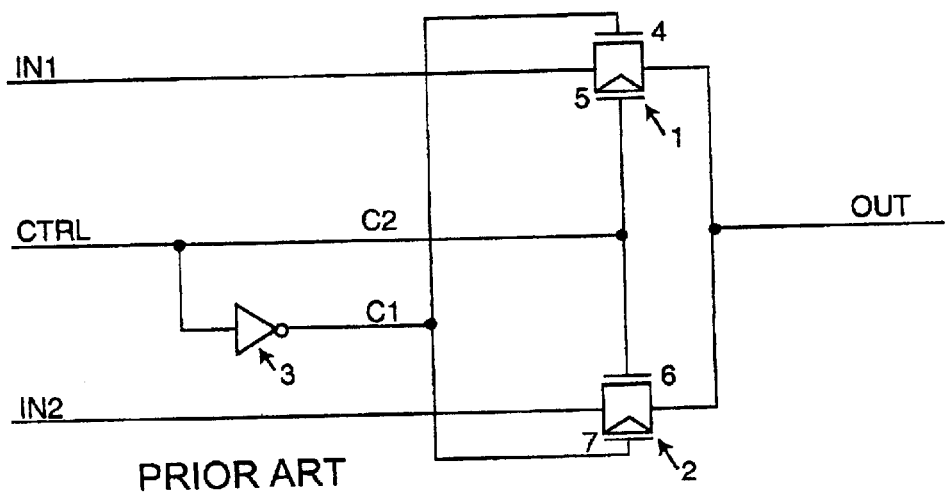
FIG. 3 is a circuit schematic of a prior art multiplexer.

Identical and functionally equivalent components in FIGS. 1 and 2 are identified with the same reference symbols as in FIG. 3.

Referring now to the figures of the drawing that illustrate the invention and first, particularly, to FIG. 1 thereof, there is seen an additional pass element 8 in the path of the control signal C2. Like the pass elements 1 and 2, the additional pass element 8 comprises an n-channel MOS transistor 9 and a p-channel MOS transistor 10. Gates of these transistors 9 and 10, which are connected in parallel with one another, like the transistor pairs 4, 5 and 6, 7, have supply voltages VDD and VSS, respectively, applied to them.

The pass element 8 is designed or "optimized" such that its delay is equivalent to the delay of the inverter 3. This ensures that the signals C1 and C2 obtained from the control signal CTRL switch the transistors 4 to 7 at the same time, so that, for time-critical applications as well, the output signal is guaranteed to be obtained at the output OUT with the same delay in each case.

FIG. 2 shows an exemplary embodiment in which there is only one input signal IN1, which is fed to the pass element 1 directly and to the pass element 2 via a further inverter 11. one advantageous use of the multiplexer according to the invention, for example, is where the control signal CTRL is dynamic and input signals IN1, IN2 are more likely static, for example in order to produce an XOR gate in which the control signal CTRL has a constant delay up to the output OUT.

We claim:

1. An optimized-delay multiplexer, comprising:

a first path carrying a control signal and a second path receiving the control signal;

an inverter connected in said second path for inverting the control signal and forming an inverted control signal;

a first pass element connected in said first path and driven by the control signal directly;

a second pass element connected in said second path and driven by the inverted control signal; and a third pass element connected in said first path for simulating a delay caused by said inverter.

2. The optimized-delay multiplexer according to claim 1, wherein said first pass element has an input receiving an input signal and said second pass element has an input receiving an input signal separate from the input signal of said first pass element.

3. The optimized-delay multiplexer according to claim 1, wherein said first pass element has an input receiving an input signal and said second pass element has an input receiving the input signal in an inverted state.

4. The optimized-delay multiplexer according to claim 1, wherein the first pass element, the second pass element, and the third pass element each comprises an n-channel MOS transistor and a p-channel MOS transistor connected in parallel with said n-channel MOS transistor.

* * * * *